US012628433B2

(12) United States Patent
Lin et al.

(10) Patent No.: US 12,628,433 B2
(45) Date of Patent: May 12, 2026

(54) SEMICONDUCTOR STRUCTURE AND METHOD OF MANUFACTURE

(71) Applicant: Taiwan Semiconductor Manufacturing Company Limited, Hsin-Chu (TW)

(72) Inventors: Hung-Chou Lin, Douliu City (TW); Yi-Cheng Chiu, New Taipei City (TW); Chen-Chien Chang, Zhubei City (TW); Kang-Tai Peng, Zhubei City (TW); Tian Sheng Lin, Taoyuan County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 467 days.

(21) Appl. No.: 18/122,215

(22) Filed: Mar. 16, 2023

(65) Prior Publication Data

US 2024/0312980 A1     Sep. 19, 2024

(51) Int. Cl.
H10D 89/60 (2025.01)
(52) U.S. Cl.
CPC .................................. H10D 89/711 (2025.01)

(58) Field of Classification Search
None
See application file for complete search history.

(56) References Cited

U.S. PATENT DOCUMENTS 7,776,700 B2 * 8/2010 Yang .................... H10D 62/151
257/408
2018/0323184 A1 * 11/2018 Hung ................... H10D 89/711

* cited by examiner

*Primary Examiner* — Bilkis Jahan
(74) *Attorney, Agent, or Firm* — Cooper Legal Group, LLC

(57) ABSTRACT

A semiconductor structure and method of manufacture is provided. In some embodiments, a semiconductor structure includes a first doped well doped with a first impurity having a first conductivity type, a second doped well adjacent the first doped well and doped with a second impurity having a second conductivity type opposite the first conductivity type, a third doped well adjacent the second doped well and doped with a third impurity having the first conductivity type, a fourth doped region in the third doped well and doped with a fourth impurity having the second conductivity type, and a deep doped well doped with a fifth impurity having the first conductivity type under a first portion of the second doped well, under the third doped well, and under the fourth doped region.

20 Claims, 12 Drawing Sheets

100

110

105

100

110

120

105

125

115

SEMICONDUCTOR STRUCTURE AND METHOD OF MANUFACTURE

BACKGROUND

An electro-static discharge (ESD) event is a sudden and unexpected voltage or current that transfers energy to a device. ESD events are known to render a device less operable than desired or inoperable altogether. Semiconductor structures include ESD protection devices to reduce the likelihood of damage from ESD events.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
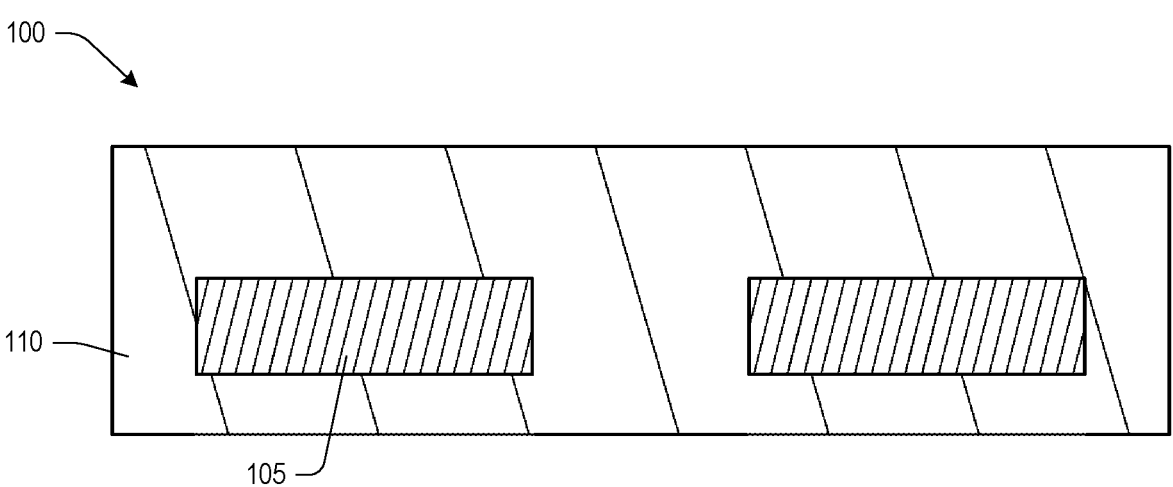
FIGS. 1-11 are illustrations of a semiconductor structure at various stages of fabrication, in accordance with some embodiments.

The following disclosure provides many different embodiments, or examples, for implementing different features of the provided subject matter. Specific examples of components and structures are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to a semiconductor structure and a method for fabricating a semiconductor structure. In accordance with some embodiments, a device, such as an electro-static discharge (ESD) protection device, is formed by forming an anode comprising a first doped well in a semiconductor layer and forming a cathode comprising a second doped well in the semiconductor layer counter-doped with respect to the first doped well. A deep doped well is formed under the first doped well and the second doped well. A counter-doped well is formed in the first doped well. The counter-doped well, the deep doped well, and the second doped well define a parasitic bipolar junction transistor in parallel with the anode and the cathode. The parasitic bipolar junction transistor increases the allowable current load of the ESD device and increases the human body mode (HBM) voltage.

FIGS. 1-11 illustrate a semiconductor structure 100 at various stages of fabrication, in accordance with some embodiments. Referring to FIG. 1, a buried well 105 is formed in a semiconductor layer 110, in accordance with some embodiments. In some embodiments, the semiconductor layer 110 is part of a substrate comprising at least one of an epitaxial layer, a single crystalline semiconductor material such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, a wafer, or a die formed from a wafer. In some embodiments, the semiconductor layer 110 comprises at least one of crystalline silicon or other suitable materials. The semiconductor layer 110 may be doped with a P-type impurity, such as at least one of boron, $BF_2$, or other suitable p-type impurities. Other structures and/or configurations of the semiconductor layer 110 are within the scope of the present disclosure.

The buried well 105 is formed to have an opposite conductivity type compared to that of the semiconductor layer 110. In some embodiments, the buried well 105 is doped with an N-type impurity, such as at least one of phosphorous, arsenic, or other suitable n-type impurities, since the semiconductor layer 110 is doped with a P-type impurity. In another embodiment where the semiconductor layer 110 is doped with an N-type impurity, the buried well 105 is doped with a P-type impurity. The buried well 105 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the buried well 105. The buried well 105 may have a racetrack structure. In a top view, a racetrack structure is a region arranged as a closed loop. For example, in the cross-sectional view of FIG. 1, the buried well 105 appears to have two discrete segments. However, in a top view, the two segments are part of a contiguous structure such that the two segments are not actually discrete. The racetrack structure may be square, rectangular, oval, circular, or some other closed-loop shape. The corners of the racetrack structure may be rounded.

Figure 2:
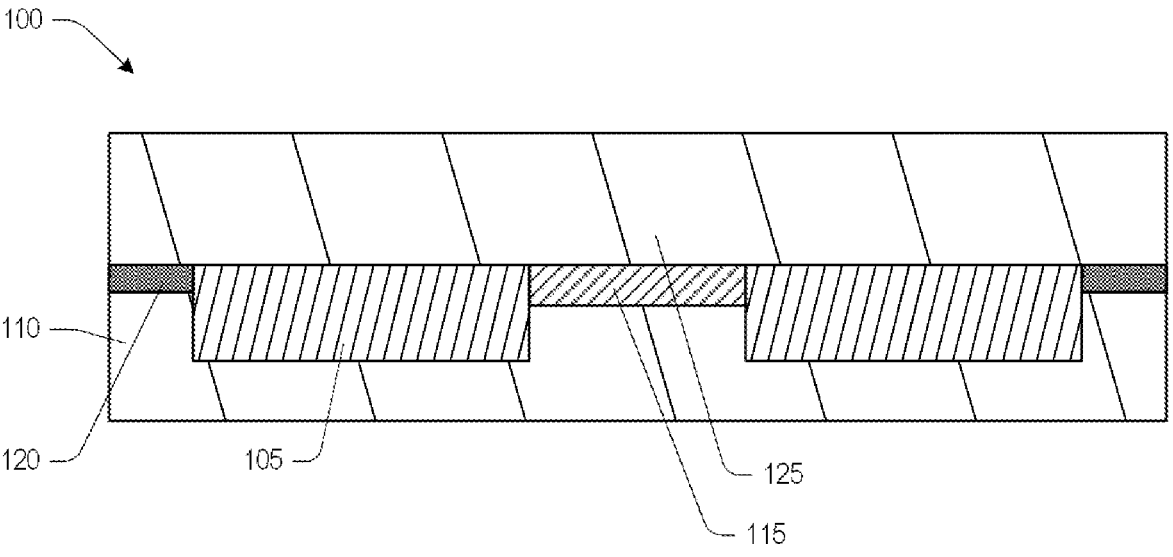

Referring to FIG. 2, a first blocking layer 115 and a second blocking layer 120 are formed in the semiconductor layer 110, in accordance with some embodiments. The first blocking layer 115 in an interior region adjacent the buried well 105 and has an opposite conductivity type compared to that of the semiconductor layer 110 and the same conductivity type compared to the buried well 105. In some embodiments, the first blocking layer 115 is doped with an N-type impurity, such as at least one of phosphorous, arsenic, or other suitable n-type impurities, since the buried well 105 is also doped with an N-type impurity. The first blocking layer 115 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the first blocking layer 115. The first blocking layer 115 may be formed as an island structure in the interior of the racetrack structure defined by the buried well 105. In a top view, an island structure appears like an island surrounded by the adjacent racetrack structure.

The second blocking layer 120 is formed adjacent an exterior region of the buried well 105 and has the same conductivity type compared to that of the semiconductor layer 110 and the opposite conductivity type compared to the buried well 105 and the first blocking layer 115. In some embodiments, the second blocking layer 120 is doped with a P-type impurity, such as at least one of boron, $BF_2$, or other suitable p-type impurities, since the buried well 105 and the first blocking layer 115 are doped with an N-type impurity. The second blocking layer 120 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the second blocking layer 120. The second blocking layer 120 may comprise a racetrack structure outside the racetrack structure defined by the buried well 105.

Figure 3:
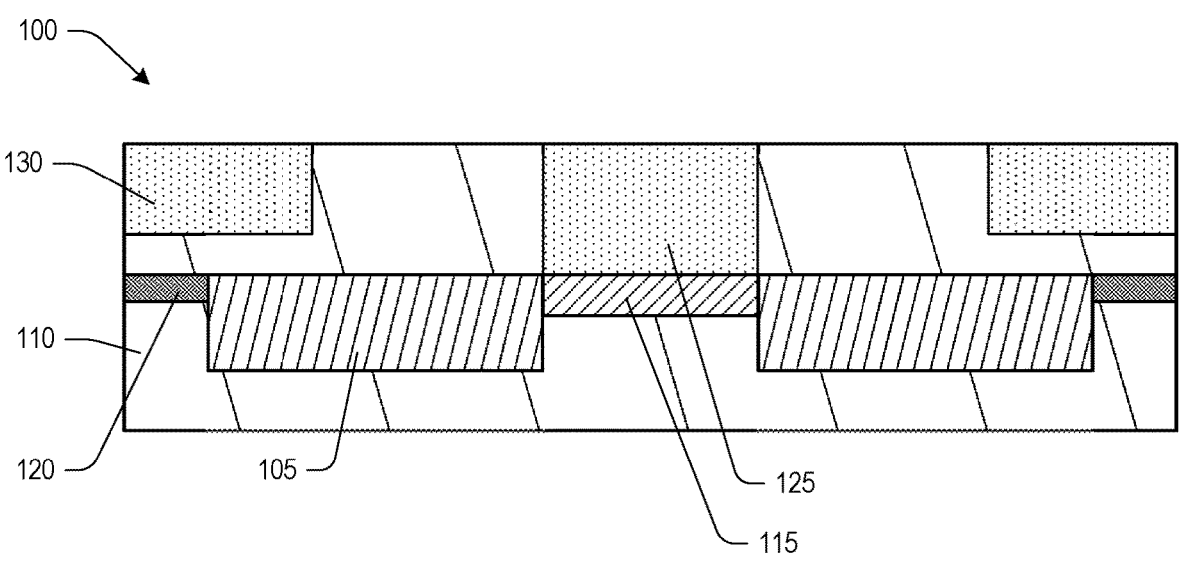

Referring to FIG. 3, a first doped well 125 and a second doped well 130 are formed in the semiconductor layer 110, in accordance with some embodiments. The first doped well 125 is formed over the first blocking layer 115 and the second doped well 130 is formed over the second blocking layer 120 and over a portion of the buried well 105. The first doped well 125 and the second doped well 130 are formed to have the same conductivity type compared to that of the semiconductor layer 110 and the opposite conductivity type compared to the buried well 105. In some embodiments, the first doped well 125 and the second doped well 130 are doped with a P-type impurity, such as at least one of boron, $BF_2$, or other suitable p-type impurities, since the buried well 105 is doped with an N-type impurity. The first doped well 125 and the second doped well 130 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the first doped well 125 and the second doped well 130. The first doped well 125 may be formed as an island shape over the first blocking layer 115. The second doped well 130 may comprise a racetrack structure over a portion of the buried well 105 and over the second blocking layer 120.

Figure 4:
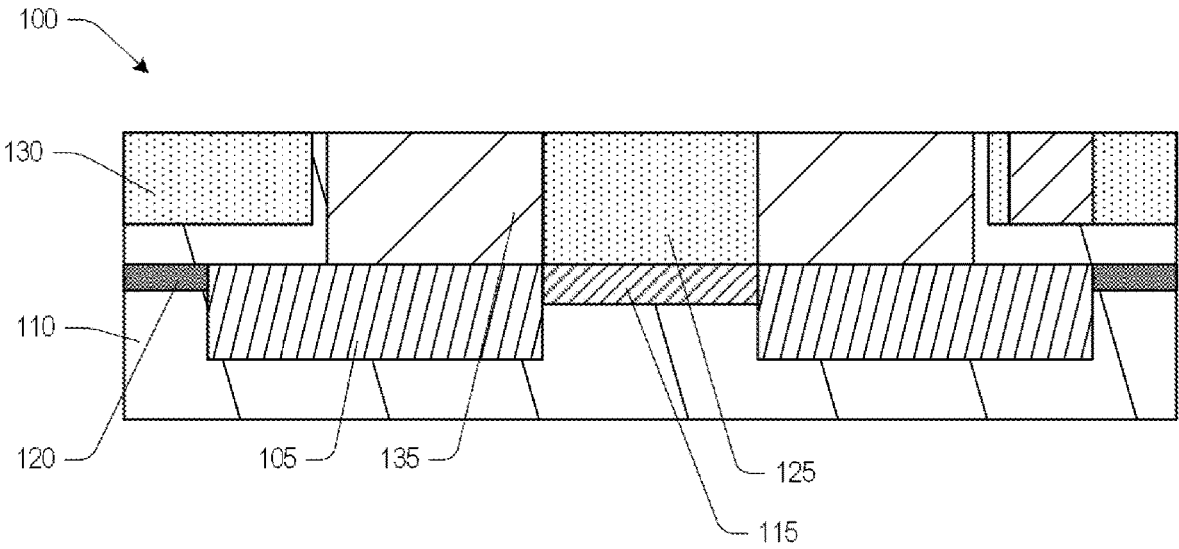

Referring to FIG. 4, a high voltage doped well 135 is formed in the semiconductor layer 110, in accordance with some embodiments. The high voltage doped well 135 is formed over a portion of the buried well 105. The high voltage doped well 135 is formed to have the same conductivity type compared to that of the buried well 105 and the opposite conductivity type compared to the first doped well 125 and the second doped well 130. The high voltage doped well 135 is spaced laterally from the second doped well 130 such that a PN junction is formed between the high voltage doped well 135 and the first doped well 125, but no PN junction is formed between the high voltage doped well 135 and the second doped well 130. In some embodiments, the high voltage doped well 135 is doped with an N-type impurity, such as at least one of phosphorous, arsenic, or other suitable n-type impurities, since the first doped well 125 and the second doped well 130 and doped with a P-type impurity. The high voltage doped well 135 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the high voltage doped well 135. The high voltage doped well 135 may comprise a racetrack structure around the first doped well 125.

Figure 5:
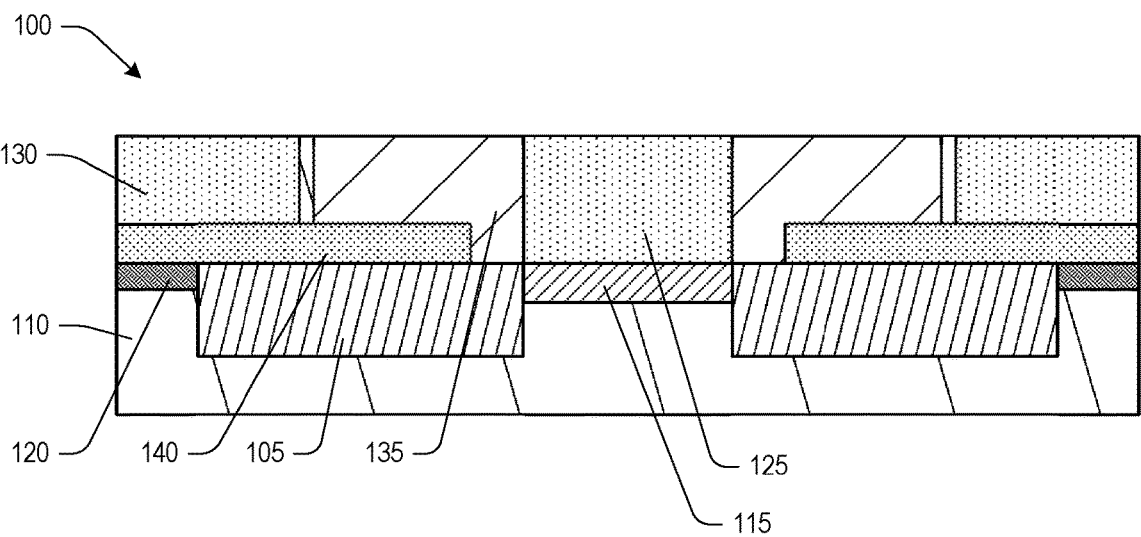

Referring to FIG. 5, a deep doped well 140 is formed in the semiconductor layer 110, in accordance with some embodiments. The deep doped well 140 is in a portion of the high voltage doped well 135 over a portion of the buried well 105 and in a portion of the second doped well 130 over a portion of the buried well 105 and the second blocking layer 120. The deep doped well 140 is formed to have the same conductivity type compared to that of the first doped well 125 and the second doped well 130 and the opposite conductivity type compared to the high voltage doped well 135. In some embodiments, the deep doped well 140 is doped with a P-type impurity, such as at least one of boron, $BF_2$, or other suitable p-type impurities, since the first doped well 125 and the second doped well 130 are doped with a P-type impurity. The deep doped well 140 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the deep doped well 140. The deep doped well 140 may comprise a racetrack structure over a portion of the buried well 105 and over the second blocking layer 120.

Figure 6:
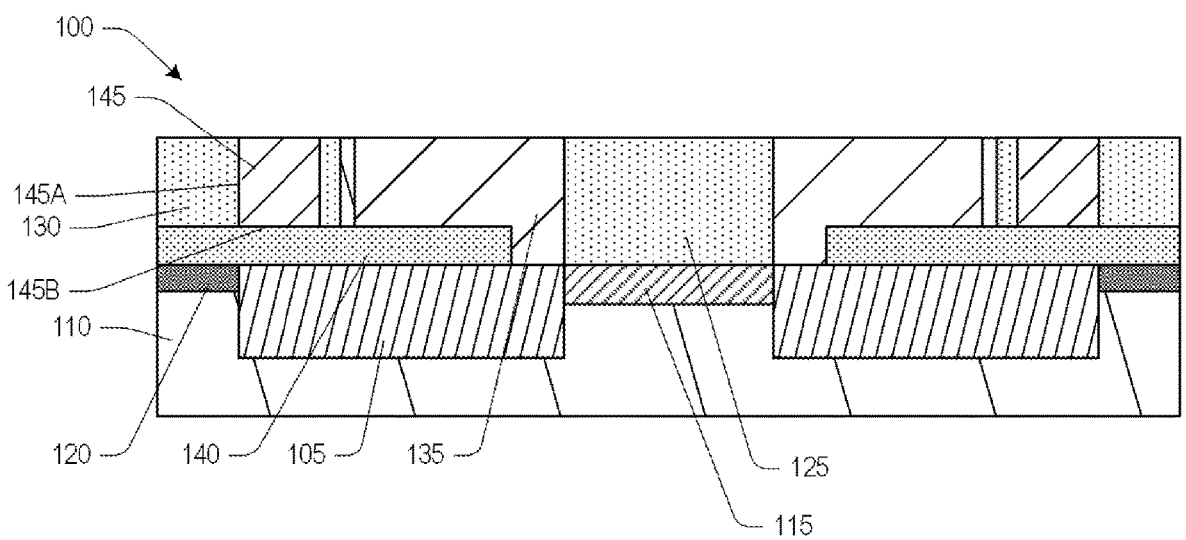

Referring to FIG. 6, a counter-doped well 145 is formed in the semiconductor layer 110, in accordance with some embodiments. The counter-doped well 145 is formed in the second doped well 130 and has the opposite conductivity type compared to that of the second doped well 130 and the deep doped well 140, such that a PN-junction 145A is formed with the second doped well 130 and a PN junction 145B is formed with the deep doped well 140. A lowermost surface of the counter-doped well 145 may contact an uppermost surface of the deep doped well 140 at the PN junction 145B. In some embodiments, the counter-doped well 145 is doped with an N-type impurity, such as at least one of phosphorous, arsenic, or other suitable n-type impurities, since the second doped well 130 and the deep doped well 140 are doped with a P-type impurity. The counter-doped well 145 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the counter-doped well 145. The counter-doped well 145 may comprise a racetrack structure over a portion of the buried well 105 and over the second blocking layer 120.

Figure 7:
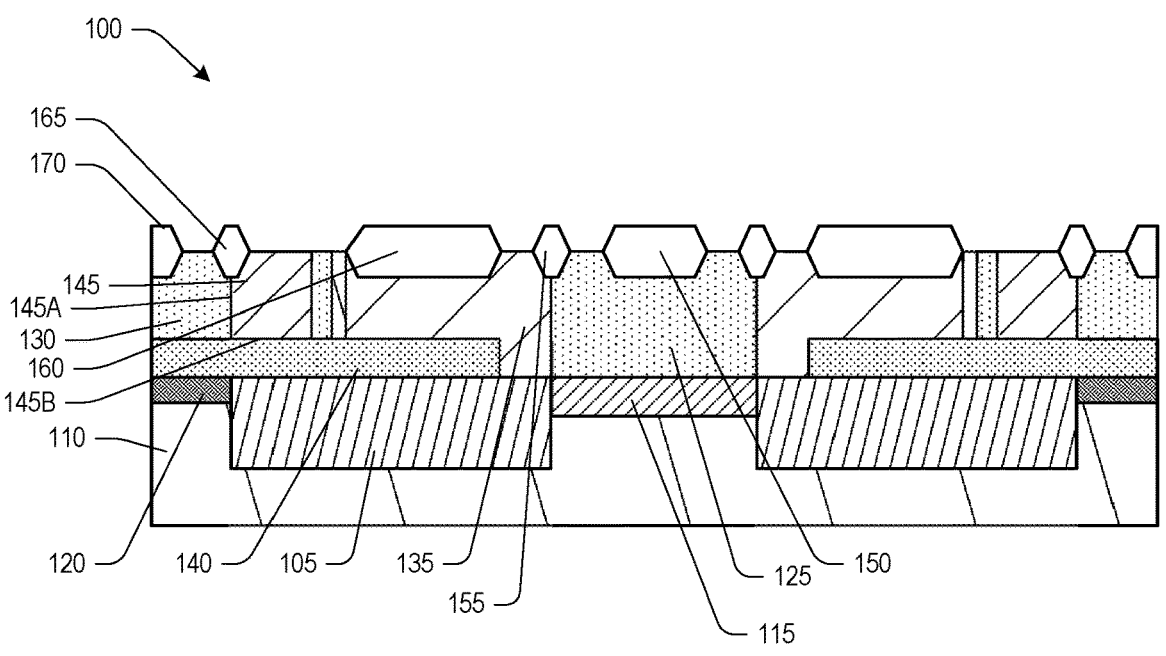

Referring to FIG. 7, field isolation structures 150, 155, 160, 165, 170 are formed over the semiconductor layer 110, in accordance with some embodiments. The field isolation structures 150, 155, 160, 165, 170 may be formed by forming a dielectric layer, such as silicon dioxide, over the semiconductor layer 110 and performing a patterning process to form the field isolation structures 150, 155, 160, 165, 170. A patterned hard mask may be formed over an upper surface of the dielectric layer and an etching process may be performed using the patterned hard mask layer as an etch template to etch the dielectric layer to form the field isolation structures 150, 155, 160, 165, 170.

Figure 8:
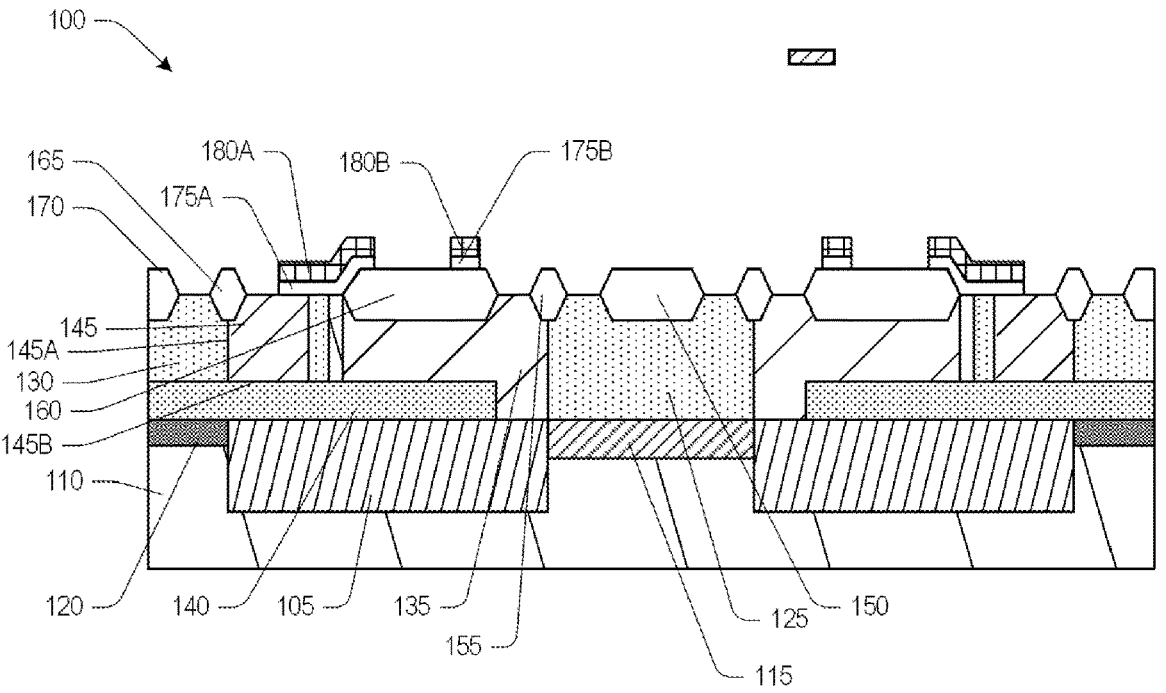

Referring to FIG. 8, dielectric layers 175A, 175B and contact field plates 180A, 180B are formed over a portion of the semiconductor layer 110 and over the field isolation structure 160, in accordance with some embodiments. In some embodiments, the dielectric layers 175A, 175B and contact field plates 180A, 180B are formed by forming a conformal dielectric layer and a conformal conductive layer over the semiconductor layer 110 and the field isolation structures 150, 155, 160, 165, 170 and performing a patterning process to remove portions of the conformal dielectric layer and the conformal conductive layer not adjacent the field isolation structure 160. In some embodiments, the patterning process uses a mask, such as a photoresist mask or a mask stack comprising at least one of a hard mask layer, a bottom antireflective coating (BARC) layer, a photoresist layer, or other suitable mask stack layers. An etch process is used to remove portions of the conformal dielectric layer and the conformal conductive layer not covered by the photoresist mask or mask stack. In some embodiments, the dielectric layers 175A, 175B comprises a resist protective oxide (RPO) layer having a higher porosity than silicon dioxide. In some embodiments, the contact field plates 180A. 180B comprise titanium nitride (TiN).

Figure 9:
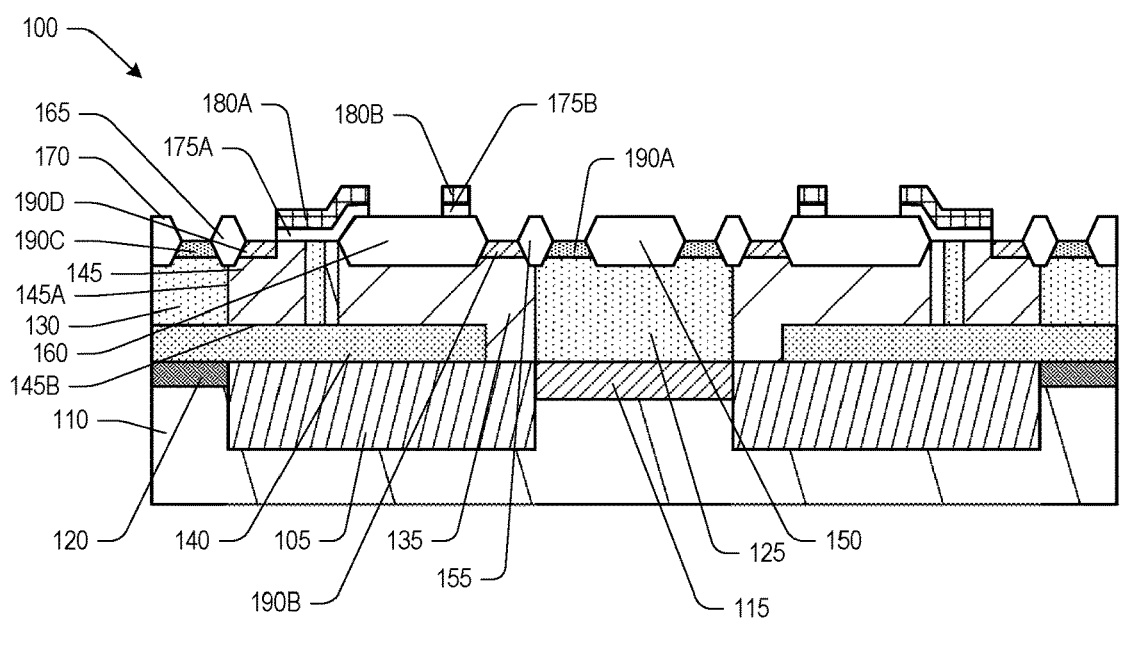

Referring to FIG. 9, contact regions 190A, 190B, 190C, 190D are formed in the semiconductor layer 110, in accordance with some embodiments. The contact region 190A is formed in the first doped well 125, the contact region 190B is formed in the high voltage doped well 135, the contact region 190C is formed in the second doped well 130, and the contact region 190D is formed in the counter-doped well 145. The contact regions 190A, 190C are doped with a P-type impurity, such as at least one of boron, $BF_2$, or other suitable p-type impurities. The contact regions 190B, 190D are doped with an N-type impurity, such as at least one of phosphorous, arsenic, or other suitable n-type impurities. The contact regions 190A, 190B, 190C, 190D may be formed by implantation processes having doses and energy selected to provide target depths, target thicknesses, and target impurity concentrations. Patterned photoresist layers may be formed over an upper surface of the semiconductor layer 110 and the field isolation structures 150, 155, 160, 165, 170 before the implantation processes are performed. The patterned photoresist layers serve masks during the implantation processes to form the contact regions 190A, 190B, 190C, 190D.

The order of the steps for forming the doped regions in FIGS. 1-9 may vary. In some embodiments, the contact regions 190A, 190B, 190C, 190D have a "very high" relative impurity concentration, the first blocking layer 115 and the second blocking layer 120 have a "high" impurity concentration, the first doped well 125, the second doped well 130, and the high voltage doped well 135 have a "medium" relative impurity concentration, the deep doped well 140 has a "medium low" relative impurity concentration, and the buried well 105 has a "low" relative impurity concentration. In some embodiments, a width of the Referring to FIG. 10, a metallization structure 196 is formed in a dielectric layer 198, in accordance with some embodiments. The metallization structure 196 comprises anode contacts 200A, 200B, 200C connected to an anode line 205, cathode contacts 210A, 210B connected to a cathode line 215A, and a base contact 210C connected to a base line 215B. The anode contact 200A contacts the contact region 190C in the second doped well 130, the anode contact 200B contacts the contact region 190D in the counter-doped well 145, and the anode contact 200C contacts the contact field plate 180A. The cathode contact 210A contacts the contact field plate 180B, the cathode contact 210B contacts the contact region 190B in the high voltage doped well 135, and the base contact 210C contacts the contact region 190A in the first doped well 125.

The dielectric layer 195 comprises silicon dioxide, a low-k dielectric material, one or more layers of low-k dielectric material, and/or other suitable materials. Low-k dielectric materials have a k value lower than about 3.9. The materials for the dielectric layer 195 comprise at least one of Si, O, C, or H, such as carbon doped oxide dielectrics, SiCOH or SiOC, or other suitable materials. Organic material such as polymers may be used for the dielectric layer 195. The dielectric layer 195 may comprise at least one of a carbon-containing material, organo-silicate glass, a porogen-containing material, nitrogen, and/or or other suitable materials. The dielectric layer 195 may be formed by at least one of ALD, CVD, LPCVD, ALCVD, UHVCVD, RPCVD, PECVD, MBE, LPE, spin coating, spin-on technology, or other suitable techniques.

The anode contacts 200A, 200B, 200C the cathode contacts 210A, 210B, and the base contact 210C are part of a device metallization layer (M0) of the metallization structure 196. The anode line 205, the cathode line 215A, and the base line 215B, are part of a metal "1" metallization layer (M1) of the metallization structure 196. A via 220A connects a conductive line 225A to the anode line 205A. A via 220B connects a conductive line 225B to the cathode line 215A. A via 220C connects a conductive line 225C to the base line 215B. The vias 220A, 220B, 220C and the conductive lines 225A, 225B, 225C are part of a metal "2" metallization layer (M2) of the metallization structure 196.

In some embodiments, the semiconductor structure 100 defines an ESD device 226. The second doped well 130, the counter-doped well 145, and the second counter-doped well 235 define an anode 226A of the ESD device 226. The high voltage doped well 135 defines a cathode 226C of the ESD device 226. During ESD testing, a reference voltage, such as a ground potential, is applied to the conductive line 225A, a high side supply voltage (HSVDD) is applied to the conductive line 225B, and a high side reference voltage (HSVSS) is applied to the conductive line 225C.

The second doped well 130, the deep doped well 140, the counter-doped well 145, and the high voltage doped well 135 define a first parasitic bipolar junction (BJT) transistor 230. The second doped well 130 and the deep doped well 140 define a base of the first parasitic BJT transistor 230, the counter-doped well 145 defines the emitter of the first parasitic BJT transistor 230, and the high voltage doped well 135 defines the collector of the first parasitic BJT transistor 230. The deep doped well 140 provides a base to trigger snap-back of the first parasitic BJT transistor 230 during an ESD event. The first parasitic BJT transistor 230 increases the current load of the ESD device and increases the human body mode (HBM) voltage compared to the ESD device of FIG. 10. In some embodiments, the HBM voltage of the ESD device is increased to about at least 3 kV. The deep doped well 140 also provides a triple reduced surface field (RESURF) arrangement that reduces the surface electric field and increases the breakdown voltage of the ESD device, such as to a value over 600V, for example.

Figure 11:
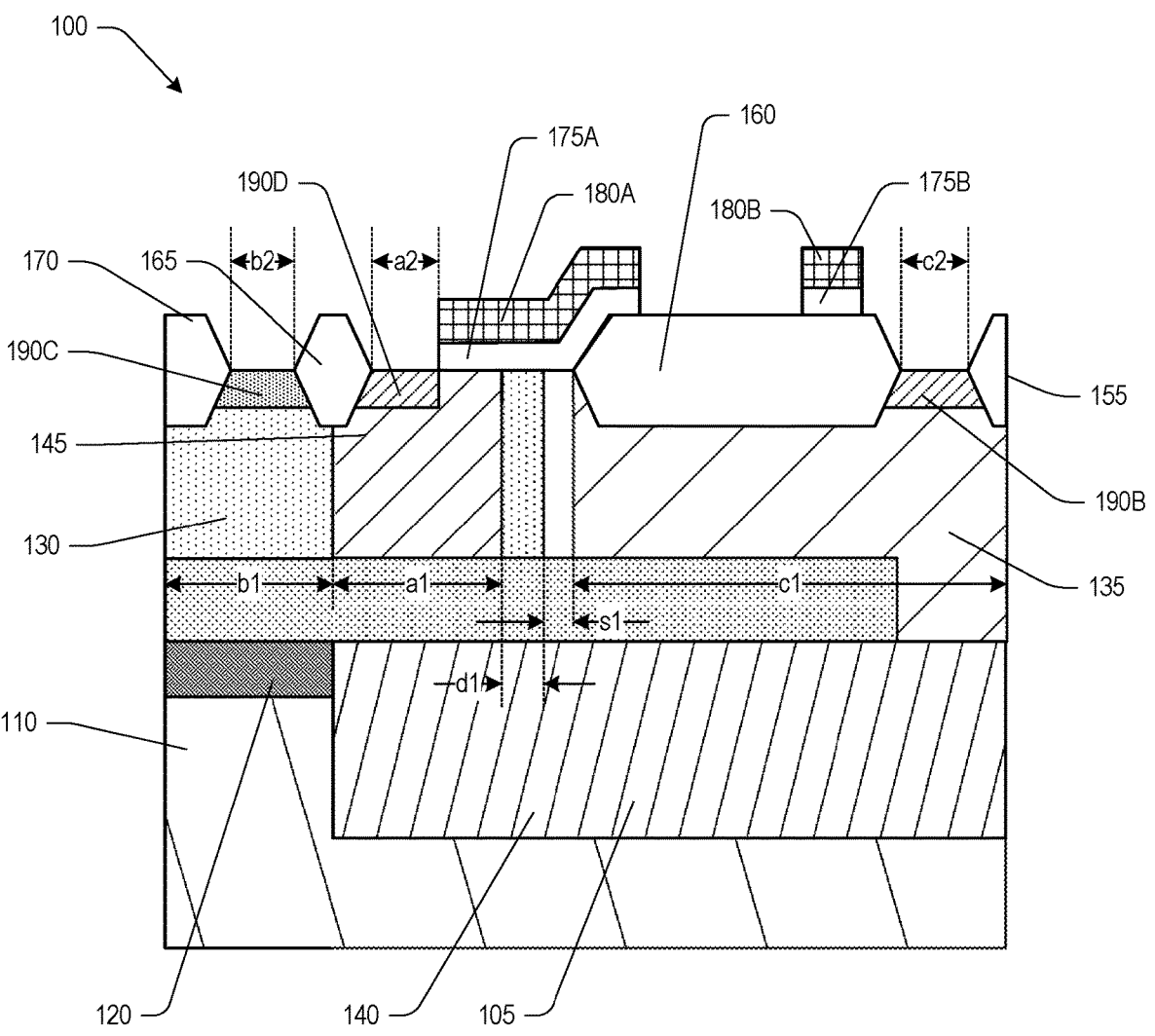

FIG. 11 is an exploded view of a portion of the semiconductor structure 100, in accordance with some embodiments. FIG. 11 illustrates example dimensions for elements of the semiconductor structure 100. A width, a1, of the counter-doped well 145 may be between about 0.05 and 30 micrometers. A width, a2, of the contact region 190D may be between about 0.01 and 10. A width, b1, of the portion of the second doped well 130 outside the counter-doped well 145 may be between about 0.05 and 30 micrometers. A width, b2, of the contact region 190C may be between about 0.01 and 10 micrometers. A width, c1, of the high voltage doped well 135 may be between about 0.05 and 30 micrometers. A width, c2, of the contact region 190B may be between about 0.01 and 10 micrometers. A distance, d1, between the inside edge of the counter-doped well 145 and the inside edge of the second doped well 130 may be between about 0.01 and 30 micrometers. A spacing, s1, between the inside edge of the second doped well 130 and the high voltage doped well 135 may be between about 0 and 10 micrometers.

Figure 12:
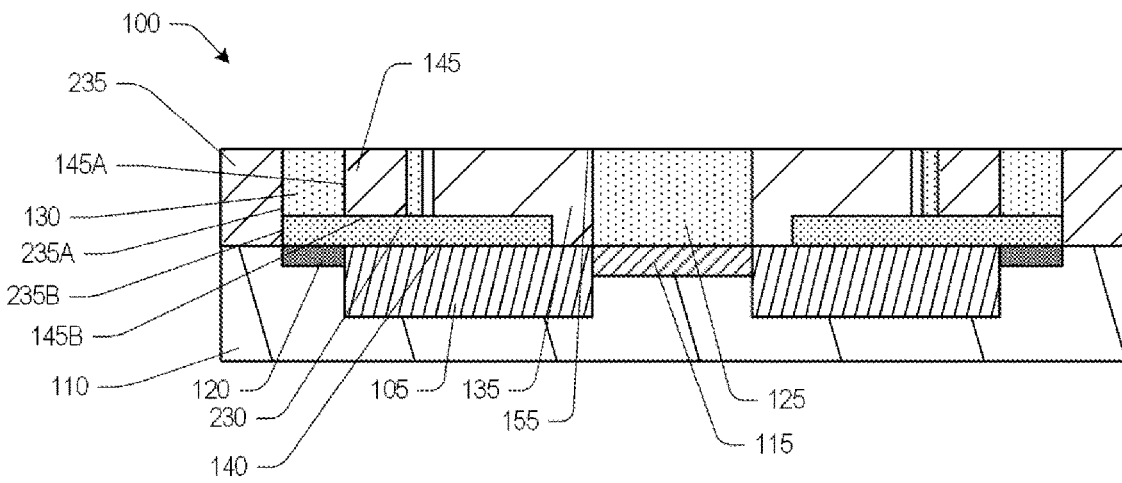
FIGS. 12-16 are illustrations of a semiconductor structure at various stages of fabrication, in accordance with some embodiments.

FIGS. 12-16 illustrate a semiconductor structure 100 at various stages of fabrication, in accordance with some embodiments. FIG. 12 illustrates the semiconductor structure 100 of FIG. 6, after a second counter-doped well 235 is formed in the semiconductor layer 110, in accordance with some embodiments. The second counter-doped well 145B is formed adjacent the second doped well 130 and has the opposite conductivity type compared to that of the second doped well 130 and the deep doped well 140, such that a first PN-junction 235A is formed with the second doped well 130 and a second PN junction 235B is formed with the deep doped well 140. A sidewall surface of the second counter-doped well 235 may contact a sidewall surface of the deep doped well 140 at the PN junction 145B. In some embodiments, the second counter-doped well 235 is doped with an N-type impurity, such as at least one of phosphorous, arsenic, or other suitable n-type impurities, since the second doped well 130 and the deep doped well 140 are doped with a P-type impurity. The second counter-doped well 235 may be formed by an implantation process having a dose and energy selected to provide a target depth, a target thickness, and a target impurity concentration. A patterned photoresist layer may be formed over an upper surface of the semiconductor layer 110 before the implantation process is performed. The patterned photoresist layer serves as a mask during the implantation process to form the second counter-doped well 235. The second counter-doped well 235 may comprise a racetrack structure over a portion of the buried well 105 and over the second blocking layer 120.

Figure 13:
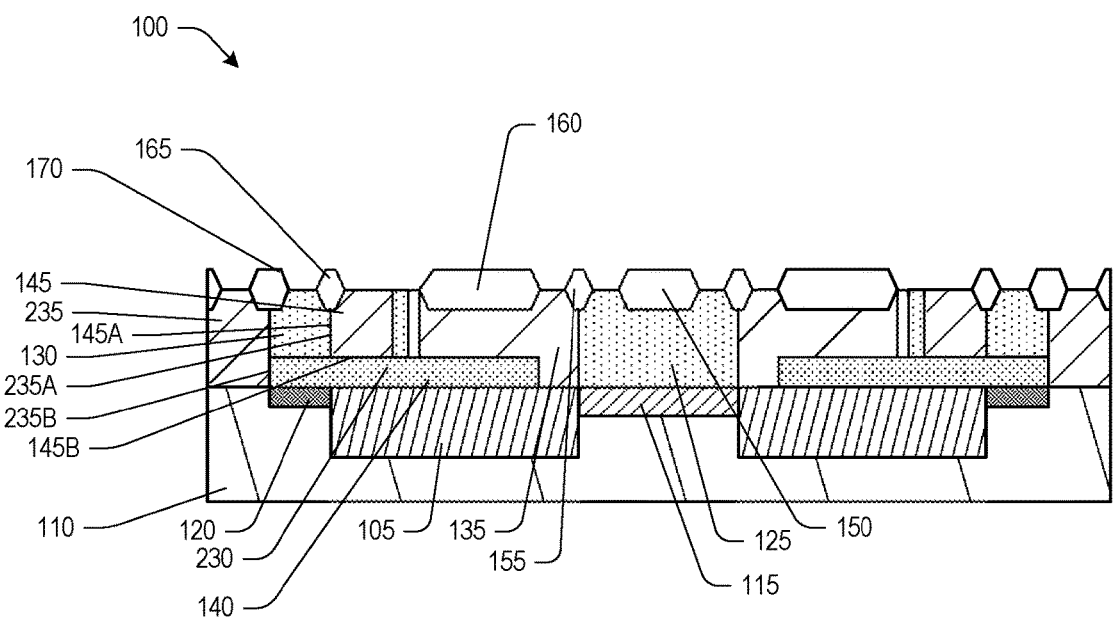

Referring to FIG. 13, field isolation structures 150, 155, 160, 165, 170, 240 are formed over the semiconductor layer 110, in accordance with some embodiments. The field isolation structures 150, 155, 160, 165, 170, 240 may be formed by forming a dielectric layer, such as silicon dioxide, over the semiconductor layer 110 and performing a patterning process to form the field isolation structures 150, 155, 160, 165, 170, 240. A patterned hard mask may be formed over an upper surface of the dielectric layer and an etching process may be performed using the patterned hard mask layer as an etch template to etch the dielectric layer to form the field isolation structures 150, 155, 160, 165, 170, 240.

Figure 14:
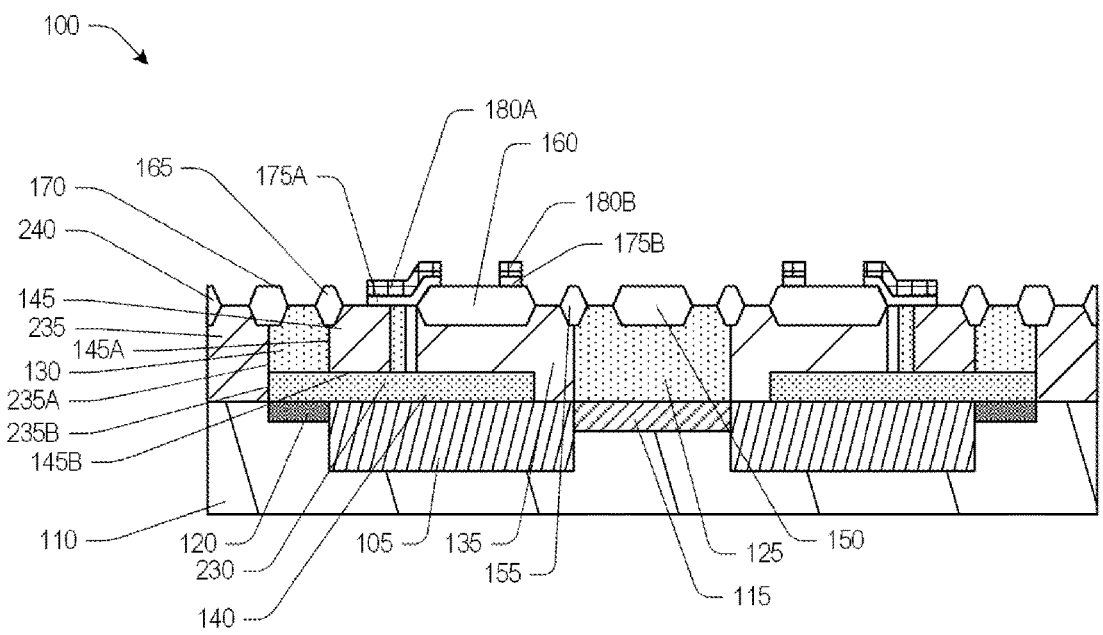

Referring to FIG. 14, dielectric layers 175A, 175B and contact field plates 180A, 180B are formed over a portion of the semiconductor layer 110 and over the field isolation structure 160, in accordance with some embodiments. In some embodiments, the dielectric layers 175A, 175B and contact field plates 180A, 180B are formed by forming a conformal dielectric layer and a conformal conductive layer over the semiconductor layer 110 and the field isolation structures 150, 155, 160, 165, 170 and performing a patterning process to remove portions of the conformal dielectric layer and the conformal conductive layer not adjacent the field isolation structure 160. In some embodiments, the patterning process uses a mask, such as a photoresist mask or a mask stack comprising at least one of a hard mask layer, a bottom antireflective coating (BARC) layer, a photoresist layer, or other suitable mask stack layers. An etch process is used to remove portions of the conformal dielectric layer and the conformal conductive layer not covered by the photoresist mask or mask stack. In some embodiments, the dielectric layers 175A, 175B comprises a resist protective oxide (RPO) layer having a higher porosity than silicon dioxide. In some embodiments, the contact field plates 180A, 180B comprise titanium nitride (TiN).

Figure 15:
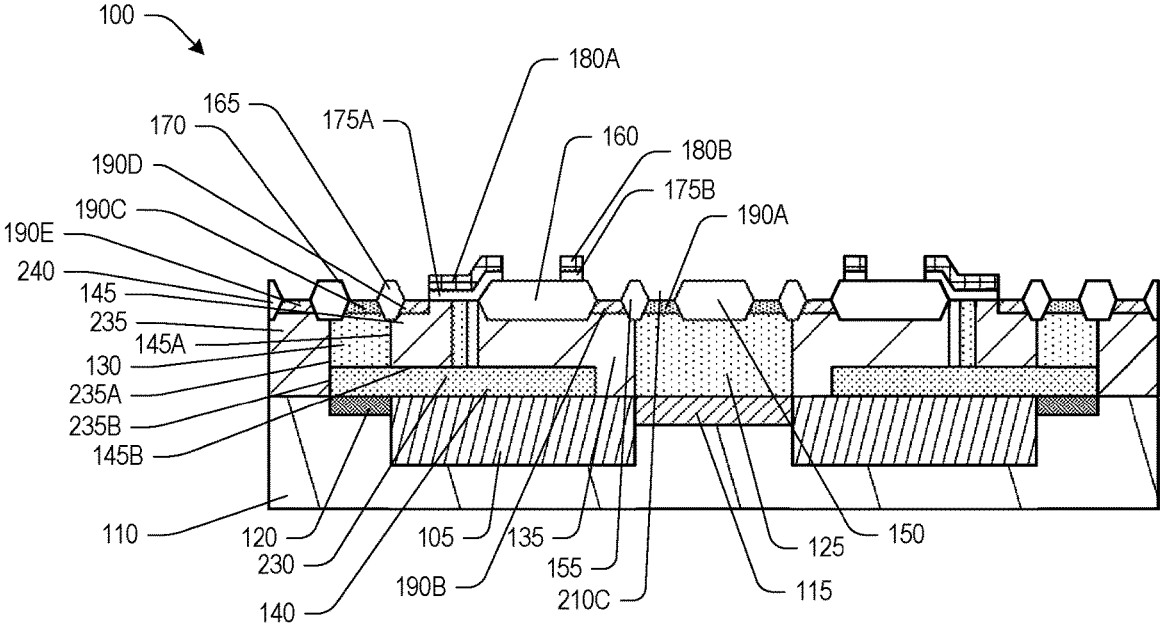
Figure 16:
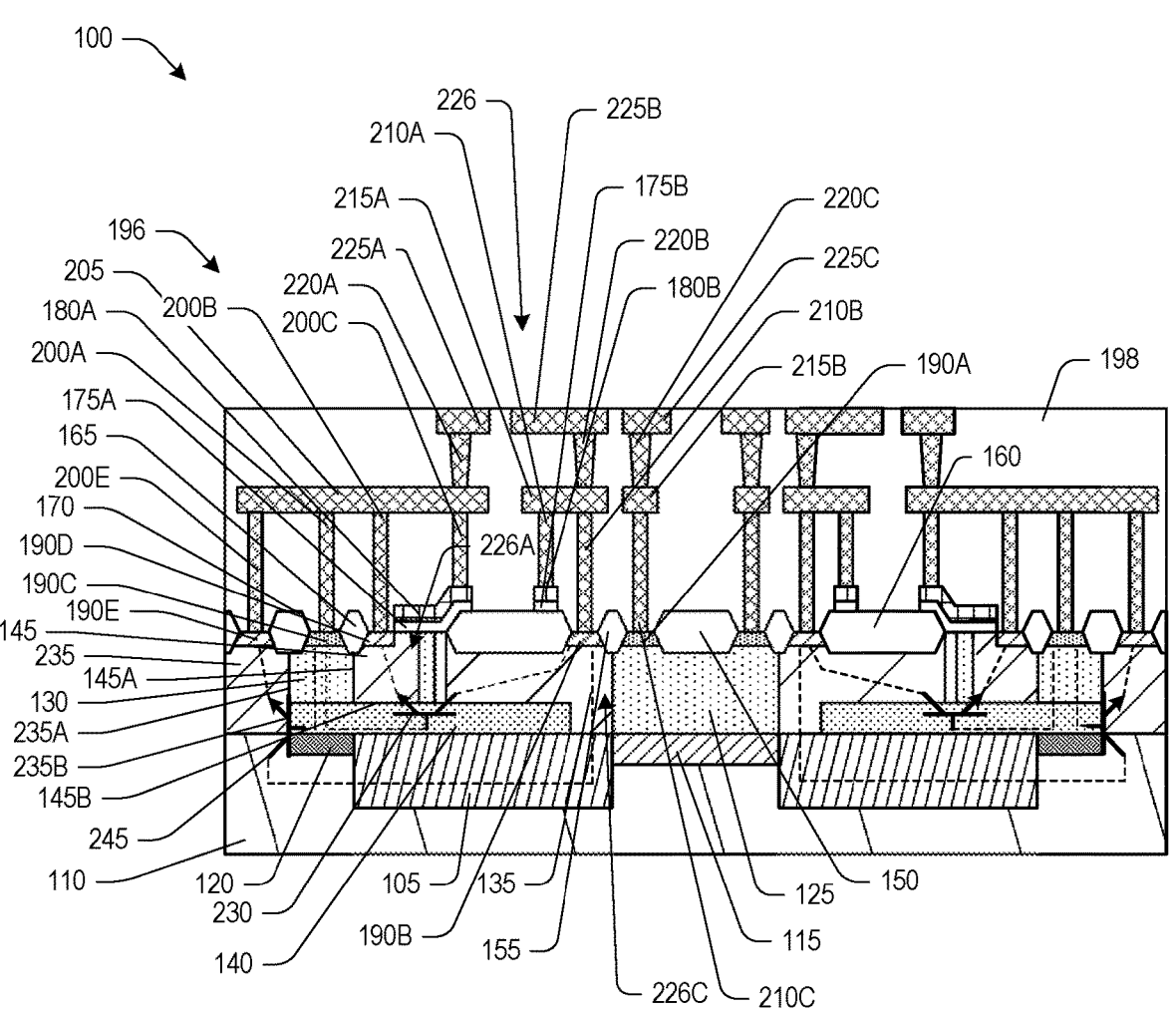

Referring to FIG. 15, contact regions 190A, 190B, 190C, 190D, 190E are formed in the semiconductor layer 110, in accordance with some embodiments. The contact region 190A is formed in the first doped well 125, the contact region 190B is formed in the high voltage doped well 135, the contact region 190C is formed in the second doped well 130, the contact region 190D is formed in the counter-doped well 145, and the contact region 190E is formed in the second counter-doped well 235. The contact regions 190A, 190C are doped with a P-type impurity, such as at least one of boron, $BF_2$, or other suitable p-type impurities. The contact regions 190B, 190D, 190E are doped with an N-type impurity, such as at least one of phosphorous, arsenic, or other suitable n-type impurities. The contact regions 190A, 190B, 190C, 190D, 190E may be formed by implantation processes having doses and energy selected to provide target depths, target thicknesses, and target impurity concentrations. Patterned photoresist layers may be formed over an upper surface of the semiconductor layer 110 and the field isolation structures 150, 155, 160, 165, 170, 240 before the implantation processes are performed. The patterned photoresist layers serve as masks during the implantation processes to form the contact regions 190A, 190B, 190C, 190D, 190E.

The order of the steps for forming the doped regions in FIGS. 1-6 and 12 may vary. In some embodiments, the contact regions 190A, 190B, 190C, 190D, 190E have a "very high" relative impurity concentration, the first blocking layer 115 and the second blocking layer 120 have a "high" impurity concentration, the first doped well 125, the second doped well 130, and the high voltage doped well 135 have a "medium" relative impurity concentration, the deep doped well 140 has a "medium low" relative impurity concentration, and the buried well 105 has a "low" relative impurity concentration. In some embodiments, a width of the Referring to FIG. 16, a metallization structure 196 is formed in a dielectric layer 198, in accordance with some embodiments. The metallization structure 196 comprises anode contacts 200A, 200B, 200C, 200D, 200E connected to an anode line 205, cathode contacts 210A, 210B connected to a cathode line 215A, and a base contact 210C connected to a base line 215B. The anode contact 200A contacts the contact region 190C in the second doped well 130, the anode contact 200B contacts the contact region 190D in the counter-doped well 145, the anode contact 200C contacts the contact field plate 180A, and the anode contact 200D contacts the contact region 190E in the second counter-doped well 235. The cathode contact 210A contacts the contact field plate 180B, the cathode contact 210B contacts the contact region 190B in the high voltage doped well 135, and the base contact 210C contacts the contact region 190A in the first doped well 125.

The dielectric layer 195 comprises silicon dioxide, a low-k dielectric material, one or more layers of low-k dielectric material, and/or other suitable materials. Low-k dielectric materials have a k value lower than about 3.9. The materials for the dielectric layer 195 comprise at least one of Si, O, C, or H, such as carbon doped oxide dielectrics, SiCOH or SiOC, or other suitable materials. Organic material such as polymers may be used for the dielectric layer 195. The dielectric layer 195 may comprise at least one of a carbon-containing material, organo-silicate glass, a porogen-containing material, nitrogen, and/or or other suitable materials. The dielectric layer 195 may be formed by at least one of ALD, CVD, LPCVD, ALCVD, UHVCVD, RPCVD, PECVD, MBE, LPE, spin coating, spin-on technology, or other suitable techniques.

The anode contacts 200A, 200B, 200C, 200D, the cathode contacts 210A, 210B, and the base contact 210C are part of a device metallization layer (M0) of the metallization structure 196. The anode line 205, the cathode line 215A, and the base line 215B, are part of a metal "1" metallization layer (M1) of the metallization structure 196. A via 220A connects a conductive line 225A to the anode line 205A. A via 220B connects a conductive line 225B to the cathode line 215A. A via 220C connects a conductive line 225C to the base line 215B. The vias 220A, 220B, 220C and the conductive lines 225A, 225B, 225C are part of a metal "2" metallization layer (M2) of the metallization structure 196.

In some embodiments, the semiconductor structure 100 defines an ESD device 2226. The second doped well 130, the counter-doped well 145, and the second counter-doped well 235 define an anode 226A of the ESD device 226. The high voltage doped well 135 defines a cathode 226C of the ESD device 226. During ESD testing, a reference voltage, such as a ground potential, is applied to the conductive line 225A, a high side supply voltage (HSVDD) is applied to the conductive line 225B, and a high side reference voltage (HSVSS) is applied to the conductive line 225C.

The second doped well 130, the deep doped well 140, the counter-doped well 145, and the high voltage doped well 135 define a first parasitic bipolar junction (BJT) transistor 230. The second doped well 130 and the deep doped well 140 define a base of the first parasitic BJT transistor 230, the counter-doped well 145 defines the emitter of the first parasitic BJT transistor 230, and the high voltage doped well 135 defines the collector of the first parasitic BJT transistor 230.

The second doped well 130, the deep doped well 140, the second counter-doped well 235, and the high voltage doped well 135 define a second parasitic bipolar junction (BJT) transistor 245. The deep doped well 140 and the second blocking layer 120 define a base of the second parasitic BJT transistor 245, the second counter-doped well 235 defines the emitter of the second parasitic BJT transistor 245, and the high voltage doped well 135 defines the collector of the second parasitic BJT transistor 245.

Figure 10:
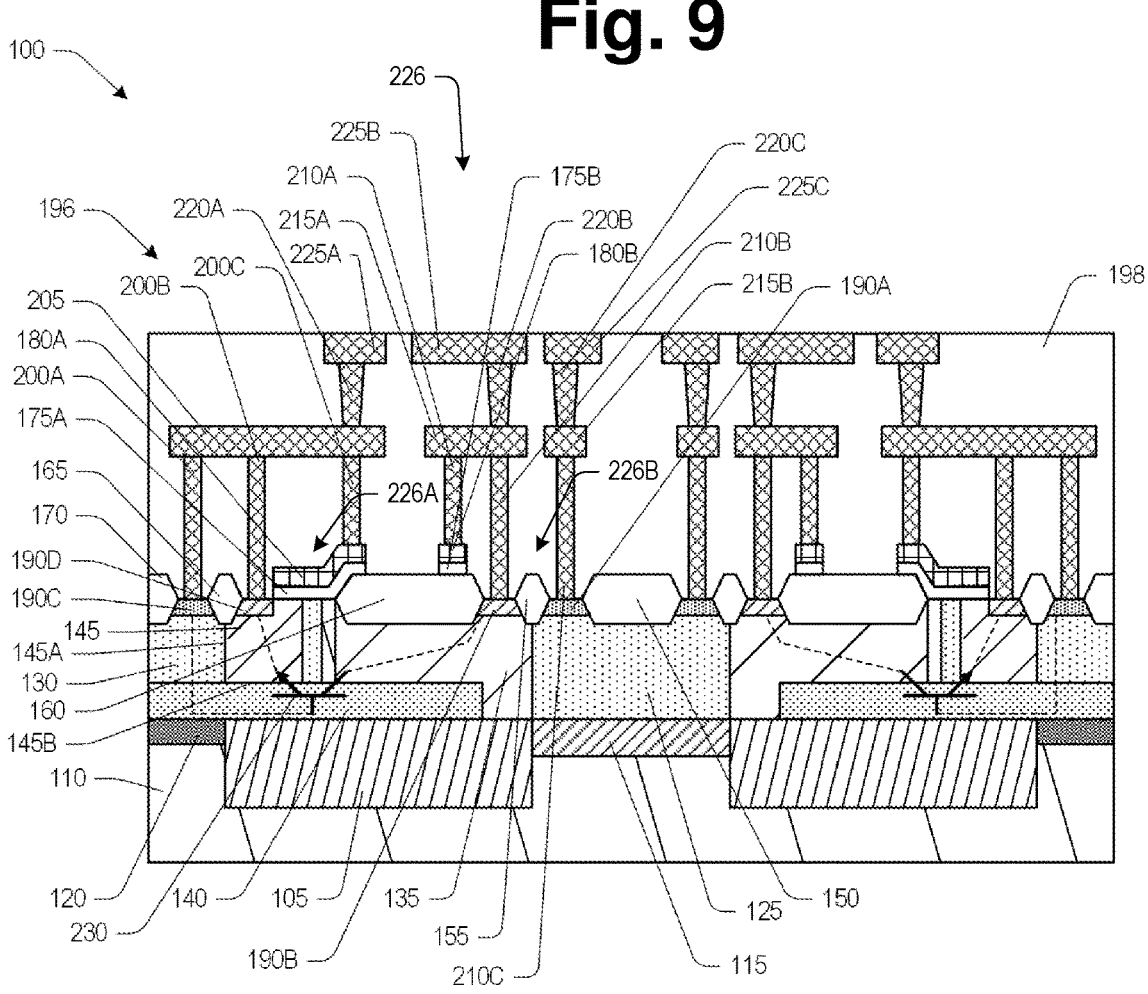

The first parasitic BJT transistor 230 and the second parasitic BJT transistor 245 further increase the current load of the ESD device and increases the human body mode (HBM) voltage compared to the ESD device of FIG. 10. In some embodiments, the HBM voltage of the ESD device is increased to about at least 3.5 kV.

Figure 17:
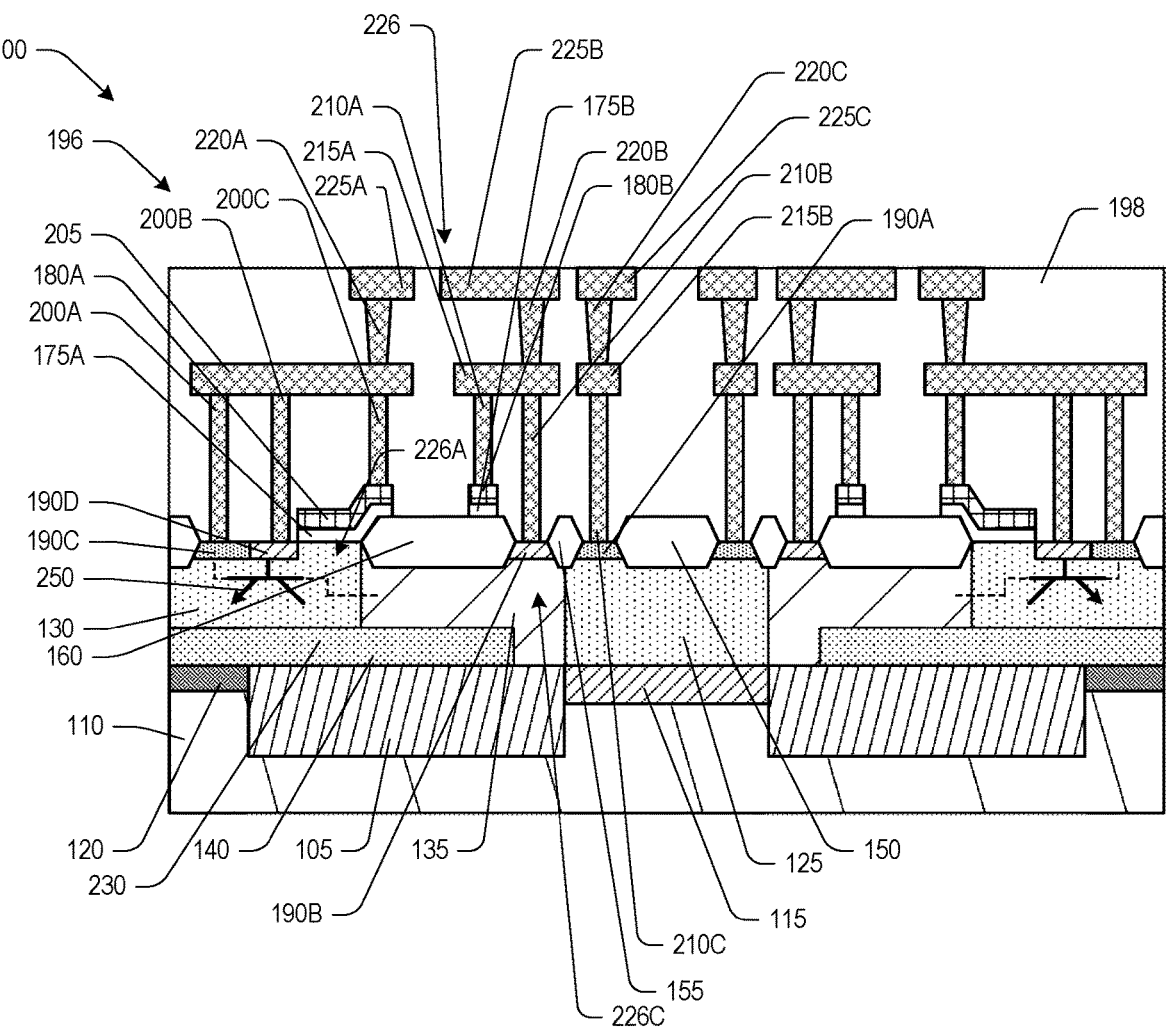
FIGS. 17 and 18 are illustrations of a semiconductor structure, in accordance with some embodiments.

FIG. 17 illustrates a semiconductor structure 100 at various stages of fabrication, in accordance with some embodiments. FIG. 17 illustrates the semiconductor structure 100 of FIG. 10, where the field isolation structure 170 and the counter-doped well 145 is omitted, in accordance with some embodiments. The spacing, s1, between the second doped well 130 and the high voltage doped well 135 illustrated in FIG. 11 may be zero. The contact regions 190C, 190D are formed in the second doped well 130. The contact region 190C is doped with a P-type impurity, such as at least one of boron, $BF_2$, or other suitable p-type impurities. The contact region 190D is doped with an N-type impurity, such as at least one of phosphorous, arsenic, or other suitable n-type impurities. In some embodiments, the semiconductor structure 100 defines an ESD device 226. The second doped well 130, the contact region 190C, and the contact region 190D define an anode 226A of the ESD device 226. The high voltage doped well 135 defines a cathode 226C of the ESD device 226. During ESD testing, a reference voltage, such as a ground potential, is applied to the conductive line 225A, a high side supply voltage (HSVDD) is applied to the conductive line 225B, and a high side reference voltage (HSVSS) is applied to the conductive line 225C.

The second doped well 130, the contact regions 190C, 190D, and the high voltage doped well 135 define a parasitic bipolar junction (BJT) transistor 250. The contact region 190D comprises counter-doped region that does not extend completely through the second doped well 130. The contact region 190C and the second doped well 130 define a base of the parasitic BJT transistor 250, the contact region 190D defines the emitter of the parasitic BJT transistor 250, and the high voltage doped well 135 defines the collector of the parasitic BJT transistor 250.

Figure 18:
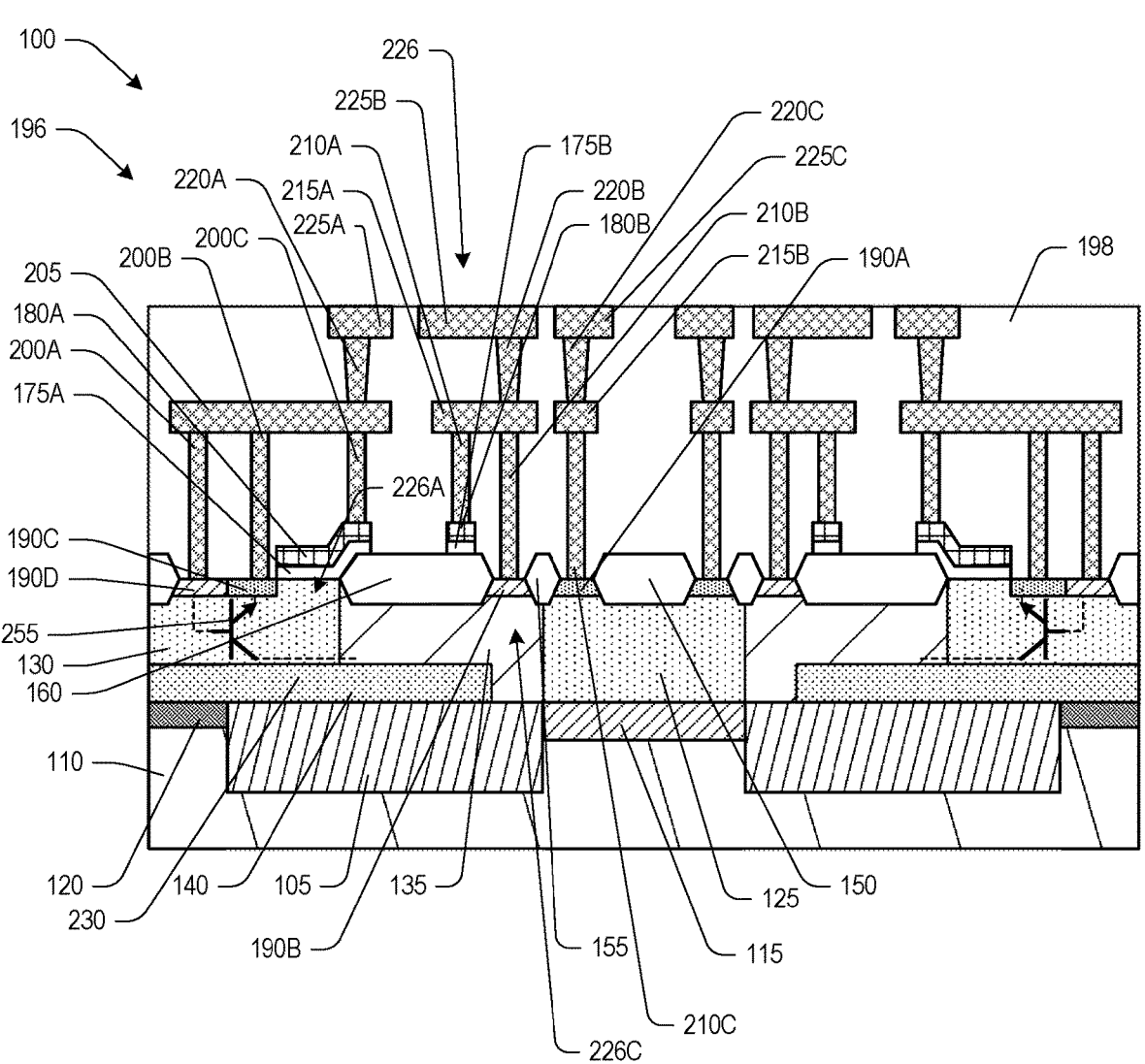

FIG. 18 illustrates a semiconductor structure 100 at various stages of fabrication, in accordance with some embodiments. FIG. 17 illustrates the semiconductor structure 100 of FIG. 10, where the field isolation structure 170 and the counter-doped well 145 is omitted, in accordance with some embodiments. The spacing, s1, between the second doped well 130 and the high voltage doped well 135 illustrated in FIG. 11 may be zero. The contact regions 190C, 190D are formed in the second doped well 130, but in a reversed orientation as compared to FIG. 17. The contact region 190C is doped with a P-type impurity, such as at least one of boron, $BF_2$, or other suitable p-type impurities. The contact region 190D is doped with an N-type impurity, such as at least one of phosphorous, arsenic, or other suitable n-type impurities. In some embodiments, the semiconductor structure 100 defines an ESD device 226. The second doped well 130, the contact region 190D, and the contact region 190D define an anode 226A of the ESD device 226. The high voltage doped well 135 defines a cathode 226C of the ESD device 226. During ESD testing, a reference voltage, such as a ground potential, is applied to the conductive line 225A, a high side supply voltage (HSVDD) is applied to the conductive line 225B, and a high side reference voltage (HSVSS) is applied to the conductive line 225C.

The second doped well 130, the contact regions 190C, 190D, and the high voltage doped well 135 define a parasitic bipolar junction (BJT) transistor 255. The contact region 190D comprises counter-doped region that does not extend completely through the second doped well 130. The contact region 190C and the second doped well 130 define a base of the parasitic BJT transistor 255, the contact region 190D defines the emitter of the parasitic BJT transistor 255, and the high voltage doped well 135 defines the collector of the parasitic BJT transistor 255.

Figure 19:
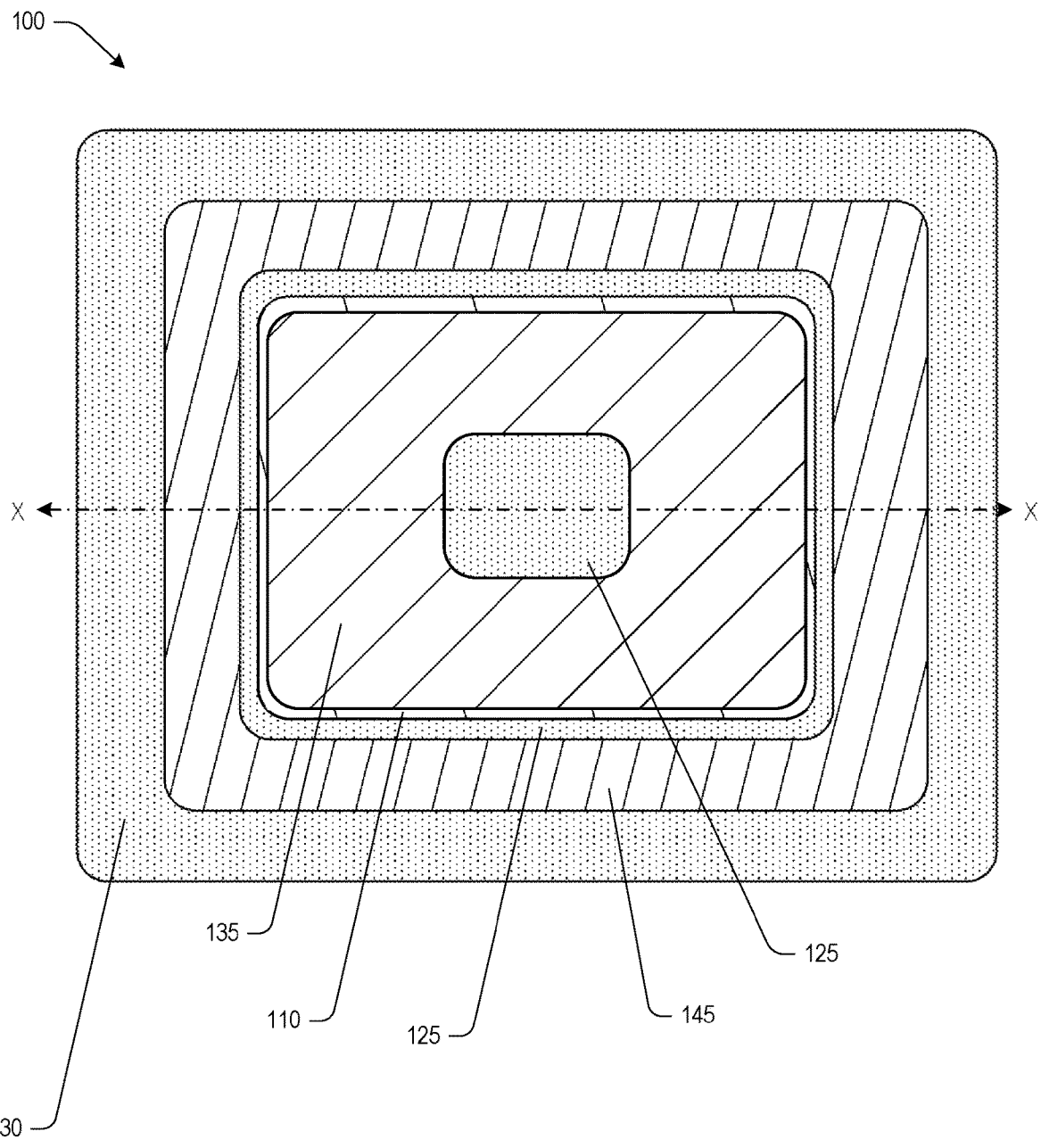
FIG. 19 is a top view of a semiconductor structure, in accordance with some embodiments.

Referring to FIG. 19, a top view of the semiconductor structure 100 is provided, in accordance with some embodiments. The first doped well 125 comprises an island structure. The second doped well 130, the high voltage doped well 135, the deep doped well 140, and the counter-doped well 145 comprise racetrack structures. The racetrack structures are closed loops, and the island structure is formed on the interior of a racetrack structure. For example, the first doped well 125 is formed in the interior region defined by the racetrack structure of the high voltage doped well 135.

In some embodiments, one or more parasitic BJT transistors 230, 245 are formed connecting the anode 226A and the cathode 226C of an ESD device 226. The parasitic BJT transistors 230, 245 provide a parallel current path between the anode 226A and the cathode 226C, thereby increasing the allowable current load of the ESD device 226 and the human body mode (HBM) voltage that may be handled by the ESD device 226. For example, providing the parasitic BJT transistor 230, may increase the HBM voltage of the ESD device 226 to about at least 3 kV, and providing both parasitic BJT transistors 230, 245 may increase the HBM voltage of the ESD device 226 to about at least 3.5 kV.

A semiconductor structure includes a first doped well doped with a first impurity having a first conductivity type, a second doped well adjacent the first doped well and doped with a second impurity having a second conductivity type opposite the first conductivity type, a third doped well adjacent the second doped well and doped with a third impurity having the first conductivity type, a fourth doped region in the third doped well and doped with a fourth impurity having the second conductivity type, and a deep doped well doped with a fifth impurity having the first conductivity type under a first portion of the second doped well, under the third doped well, and under the fourth doped region.

In some embodiments, a semiconductor structure includes an anode, a cathode adjacent the anode, and a first parasitic bipolar transistor connecting the anode to the cathode.

In some embodiments, a method of forming a semiconductor structure includes forming a first doped well doped with a first impurity having a first conductivity type in a semiconductor layer, forming a second doped well adjacent the first doped well and doped with a second impurity having a second conductivity type opposite the first conductivity type in a semiconductor layer, forming a third doped well doped with a third impurity having the first conductivity type connecting the first doped well and the second doped well, and forming a fourth doped region doped with a fourth impurity having the second conductivity type in the first doped well contacting the third doped well.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and case of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is not limited thereto. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one or more of several implementations, such feature may be combined with one or more other features of the other implementations as may be desired and advantageous for any given or particular application.

What is claimed is:

1. A semiconductor structure, comprising:
a first doped well doped with a first impurity having a first conductivity type;
a second doped well adjacent the first doped well and doped with a second impurity having a second conductivity type opposite the first conductivity type;
a third doped well adjacent the second doped well and doped with a third impurity having the first conductivity type;
a fourth doped region in the third doped well and doped with a fourth impurity having the second conductivity type;
a deep doped well doped with a fifth impurity having the first conductivity type under a first portion of the second doped well, under the third doped well, and under the fourth doped region;
a buried well doped with a sixth impurity having the second conductivity type under a second portion of the second doped well and under a first portion of the deep doped well;
a first blocking layer doped with a seventh impurity having the second conductivity type adjacent the buried well and under the first doped well; and
a second blocking layer doped with an eighth impurity having the first conductivity type adjacent the buried well and under a second portion of the deep doped well.

2. The semiconductor structure of claim 1, comprising:
a semiconductor layer between the second doped well and third doped well.

3. The semiconductor structure of claim 1, wherein:
the fourth doped region defines a first PN junction with the third doped well and a second PN junction with the deep doped well.

4. The semiconductor structure of claim 1, comprising:
a fifth doped region adjacent the third doped well and the deep doped well and doped with a seventh impurity having the second conductivity type.

5. The semiconductor structure of claim 4, wherein:
the fourth doped region defines a first PN junction with the third doped well and a second PN junction with the deep doped well; and
the fifth doped region defines a first PN junction with the third doped well and a second PN junction with the deep doped well.

6. The semiconductor structure of claim 1, wherein:
the fourth doped region extends partially into the third doped well without contacting the deep doped well.

7. The semiconductor structure of claim 1, wherein the second portion of the second doped well contacts the buried well.

8. The semiconductor structure of claim 1, wherein the second portion of the second doped well is laterally between a sidewall of the deep doped well and a sidewall of the first doped well.

9. The semiconductor structure of claim 1, wherein:
the third doped well has a first racetrack structure, and
the second doped well has a second racetrack structure disposed inside the first racetrack structure.

10. The semiconductor structure of claim 9, wherein:
the deep doped well has a third racetrack structure, and
the fourth doped region has a fourth racetrack structure embedded in the first racetrack structure.

11. A semiconductor structure, comprising:
an anode;
a cathode adjacent the anode; and
a first parasitic bipolar transistor connecting the anode to the cathode, wherein
the anode comprises a first doped well doped with a first impurity having a first conductivity type,
the cathode comprises a second doped well adjacent the first doped well and doped with a second impurity having a second conductivity type opposite the first conductivity type, and
the first parasitic bipolar transistor comprises:
a third doped region in the first doped well and doped with a third impurity having the second conductivity type; and
a deep doped well doped with a fourth impurity having the first conductivity type under the first doped well, under the third doped region, and under the second doped well.

12. The semiconductor structure of claim 11, comprising:
a buried well doped with a fifth impurity having the second conductivity type under a portion of the deep doped well and under a portion of the second doped well.

13. The semiconductor structure of claim 11, comprising:
a second parasitic bipolar transistor connecting the anode to the cathode.

14. The semiconductor structure of claim 13, wherein:
the second parasitic bipolar transistor comprises:
the deep doped well; and
a fourth doped region adjacent the first doped well and the deep doped well and doped with a fifth impurity having the second conductivity type.

15. A method of forming a semiconductor structure, comprising:
forming a first doped well doped with a first impurity having a first conductivity type in a semiconductor layer, wherein forming the first doped well comprises forming a first racetrack structure;
forming a second doped well adjacent the first doped well and doped with a second impurity having a second conductivity type opposite the first conductivity type in the semiconductor layer, wherein forming the second doped well comprises forming a second racetrack structure inside the first racetrack structure;
forming a third doped well doped with a third impurity having the first conductivity type connecting the first doped well and the second doped well, wherein forming the third doped well comprises forming a third racetrack structure under the first doped well and under a portion of the second doped well; and
forming a fourth doped region doped with a fourth impurity having the second conductivity type in the first doped well and contacting the third doped well, wherein forming the fourth doped region comprises forming a fourth racetrack structure embedded in the first racetrack structure.

16. The method of claim 15, comprising:
forming a fifth doped well doped with a fifth impurity having the second conductivity type under a second portion of the second doped well and under a portion of the fourth doped region.

17. The method of claim 16, comprising:
forming a blocking layer doped with a sixth impurity having the first conductivity type adjacent the fifth doped well and under the first doped well.

18. The method of claim 15, comprising:

forming a fifth doped region doped with a fifth impurity having the second conductivity type adjacent the first doped well and adjacent the third doped well.

19. The method of claim 15, comprising:

forming an island structure doped with a fifth impurity having the first conductivity type inside the second racetrack structure.

20. The method of claim 15, comprising:

forming a first contact contacting the first doped well;

forming a second contact contacting the second doped well;

forming a third contact contacting the fourth doped region; and forming a conductive line connecting the first contact and the third contact.

* * * * *